US008710856B2

(12) United States Patent  
Swart et al.

(10) Patent No.: US 8,710,856 B2  
(45) Date of Patent: Apr. 29, 2014

(54) TERMINAL FOR FLAT TEST PROBE

(75) Inventors: Mark A. Swart, Villa Park, CA (US); Kenneth R. Snyder, Pomona, CA (US)

(73) Assignee: LTX Credence Corporation, Norwood, MA (US)

( * ) Notice: Subject to any disclaimer, the term of this patent is extended or adjusted under 35 U.S.C. 154(b) by 635 days.

(21) Appl. No.: 12/968,023

(22) Filed: Dec. 14, 2010

(65) Prior Publication Data

US 2011/0175636 A1 Jul. 21, 2011

Related U.S. Application Data

(60) Provisional application No. 61/295,623, filed on Jan. 15, 2010.

(51) Int. Cl.
G01R 1/067 (2006.01)

(52) U.S. Cl.
USPC ........... 324/755.05; 324/755.01; 324/538; 324/756.01; 324/756.02; 324/756.03; 439/169; 439/219; 439/482; 439/817; 439/824

(58) Field of Classification Search
USPC ........... 324/755.01–755.11, 756.01–756.07, 324/538, 72.5; 439/817, 482, 169, 219, 824
See application file for complete search history.

(56) References Cited

U.S. PATENT DOCUMENTS

| | | | |
|---|---|---|---|
| 2,392,438 A | 1/1946 | Wade | |
| 5,009,613 A * | 4/1991 | Langgard et al. | 439/482 |
| 5,444,387 A | 8/1995 | Van Loan et al. | |
| 6,462,567 B1 * | 10/2002 | Vinther et al. | 324/754.14 |
| 7,253,647 B2 * | 8/2007 | Lee | 324/754.14 |
| 8,052,491 B2 * | 11/2011 | Lin | 439/786 |
| 8,105,119 B2 * | 1/2012 | Swart et al. | 439/816 |
| 2001/0039128 A1 * | 11/2001 | Tateishi et al. | 439/71 |
| 2001/0049213 A1 * | 12/2001 | Potters et al. | 439/80 |
| 2004/0053540 A1 * | 3/2004 | Wu et al. | 439/736 |
| 2007/0290703 A1 | 12/2007 | Hollman | |
| 2007/0296436 A1 * | 12/2007 | Winter | 324/761 |
| 2008/0001613 A1 | 1/2008 | Kister | |
| 2009/0075529 A1 * | 3/2009 | Johnston et al. | 439/824 |
| 2009/0189622 A1 * | 7/2009 | Tan | 324/754 |
| 2010/0244875 A1 * | 9/2010 | Chabineau-Lovgren et al. | 324/757 |

OTHER PUBLICATIONS

International Search Report and Written Opinion for International Application No. PCT/US2010/061370, mailed Feb. 16, 2011, 8 pages.

* cited by examiner

Primary Examiner — Tung X Nguyen  
Assistant Examiner — Thang Le  
(74) Attorney, Agent, or Firm — Christie, Parker & Hale, LLP

(57) ABSTRACT

A terminal end for a flat test probe having tapered cam surfaces providing a lead-in angle on the tail of the terminal end which extend to a sharp rear angle to engage detents or projections within a receptacle. The tapered cam surfaces and shape rear angles allow the probe to be inserted into the receptacle with minimal force to retain the flat test probe within the receptacle.

20 Claims, 4 Drawing Sheets

TERMINAL FOR FLAT TEST PROBE

CROSS-REFERENCE TO RELATED APPLICATIONS

This application claims priority to and the benefit of U.S. Provisional Application No. 61/295,623, filed Jan. 15, 2010, the contents of which are incorporated herein by reference.

FIELD OF THE INVENTION

The present invention relates to electrical contact probes forming electrical interconnects and, more particularly, to a terminal design for contact probes having a flat plunger.

BACKGROUND OF THE INVENTION

Conventional spring loaded contact probes generally include a movable round plunger and a tubular barrel having an open end for containing an enlarged diameter section of the plunger, and a spring for biasing the travel of the plunger in the barrel. The plunger bearing slidably engages the inner surface of the barrel. The enlarged bearing section is retained in the barrel by a crimp near the barrel open end. The plunger is commonly biased outwardly, a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head or tip for contacting electrical devices under test. The barrel may also include a tip opposite the barrel's open end.

The barrel, plunger and tips form an electrical interconnect between the electrical device under test and test equipment and as such, are manufactured from an electrically conductive material. Typically the probes are fitted into cavities formed through the thickness of a test plate or socket. Generally a contact side of the electrical device to be tested, such as an integrated circuit, is brought into pressure contact with the tips of the plungers protruding through one side of the test plate or test socket for manufacturing spring pressure against the electrical device. A contact plate connected to the test equipment is brought to contact with the tips of the plungers protruding from the other side of the test plate or test socket. The test equipment transmits signals to the contact plate from where they are transmitted through the test probe interconnects to the device being tested. After the electrical device has been tested, the pressure exerted by the spring probes is released and the device is removed from contact with the tip of each probe.

The process of making conventional spring probes involves separately producing the compression spring, the barrel and the plunger. The compression spring is wound and heat treated to produce a spring of a precise size and of a controlled spring force. The plunger is typically turned on a lathe and heat treated. The barrels are also sometimes heat treated. The barrels can be formed in a lathe or by a deep draw process. All components may be subjected to a plating process to enhance conductivity. The spring probe components are assembled either manually or by an automated process.

An important aspect of testing integrated circuits is that they are tested under high frequencies. As such impedance matching is required between the test equipment and the integrated circuit so as to avoid attenuation of the high frequency signals. Considering that spacing within a test socket is minimal, in order to avoid attenuation of the high frequency signals, the length of the electrical interconnect formed by the probes must be kept to a minimum. To address this problem external spring probes have been developed having a shorter length than conventional probes. External spring probes consist of two separate sections each having a tip and a flange. A contact component extends from each probe section opposite the tip. The two contact components contact each other and the spring is sandwiched between two flanges that surround the contact components. Typically the first contact component is a barrel while the second contact component is a bearing surface. The bearing surface is slidably engaged to the inner surface of the barrel. These probes are fitted into cavities formed in the test sockets used during testing. A problem associated with these type of external spring probes is the expense to manufacture due to costly machining operations.

In response thereto external spring probes were designed having flat components which can be produced less expensively by stamping. Typically these designs incorporate two components which are connected orthogonally and the electrical path between the two components is through a protruding end surface. A problem with this design is that the components wear out rather quickly and have a short life span requiring constant replacement.

Non-orthogonally connected external spring contact assemblies have two movable and linearly overlapping contact members or plungers surrounded by an external spring. Each plunger has a contact portion and a tail portion wherein the tail portion has a flat surface that passes over and makes contact with an opposing flat plunger tail portion inside the spring when assembled. The spring has end coils that press onto each of the opposing plungers to prevent the plungers from separating from the spring, thus fixing the plunger contact portion and the tail portions with respect to each end of the spring. Utilizing the natural torsional movement of the spring while it is compressed, the flat surfaces of the plunger tail portions maintain contact throughout the compression stroke of the contact assembly. The contact between the opposing flat sections prevents the twisting or torsional movement of the spring from translating to the tips on the contact portions. The opposition to the natural twisting enhances the electrical conductivity of the components, which in turn improves performance of the spring contact assembly. The spring can also have reduced diameter coil sections along the length of the spring to further constrain the plunger tails and enhance the interaction between the two plungers, or further biasing effect can be created by adding an offset coil section in the spring.

Each of the plungers formed in a generally cylindrical shape are by lathe, screw machine or other similar manufacturing equipment. Plungers formed in a generally flat shape are by stamping, etching, photolithography or other similar manufacturing technique for creating substantially two dimensional geometries.

Each of round probes and flat probe configurations have their advantages and disadvantages and therefore a hybrid probe which combines the advantages of the two style probes is desirable. A problem is presented as to how to retain the hybrid round/flat configuration together and consequently a need exists for a terminal design for a flat plunger which when inserted into a barrel retains the two together.

SUMMARY OF THE INVENTION

The present invention is directed to a spring contact assembly having a flat plunger, a cylindrical barrel and a compression spring wherein the plunger has a terminal design having features to retain the plunger within the barrel. The features on the terminal have tapered cam surfaces to facilitate retention. The tapered cam surfaces provide a lead-in angle on the tail of the terminal which extends to a sharp rear angle to engage a detent or projection in the receptacle or barrel.

The barrel or receptacle is formed in a general cylindrical shape suitable for lathe, screw machine or deep draw manufacturing equipment. The plunger is formed in a generally flat shape, suitable for stamping, etching, laser-cutting, electro-forming, micro-casting, photolithography or other similar manufacturing technique for creating substantially two-dimensional geometries. The contact tip incorporated into a flat plunger can be bologna style meaning curved from side to side and from top to bottom, have a contact nib, forked design, pointed or three dimensional by folding a contact end of the plunger.

These and other aspects of the present invention will be more fully understood with reference to the detailed description in combination with the drawings.

DETAILED DESCRIPTION OF THE INVENTION

Figure 1:
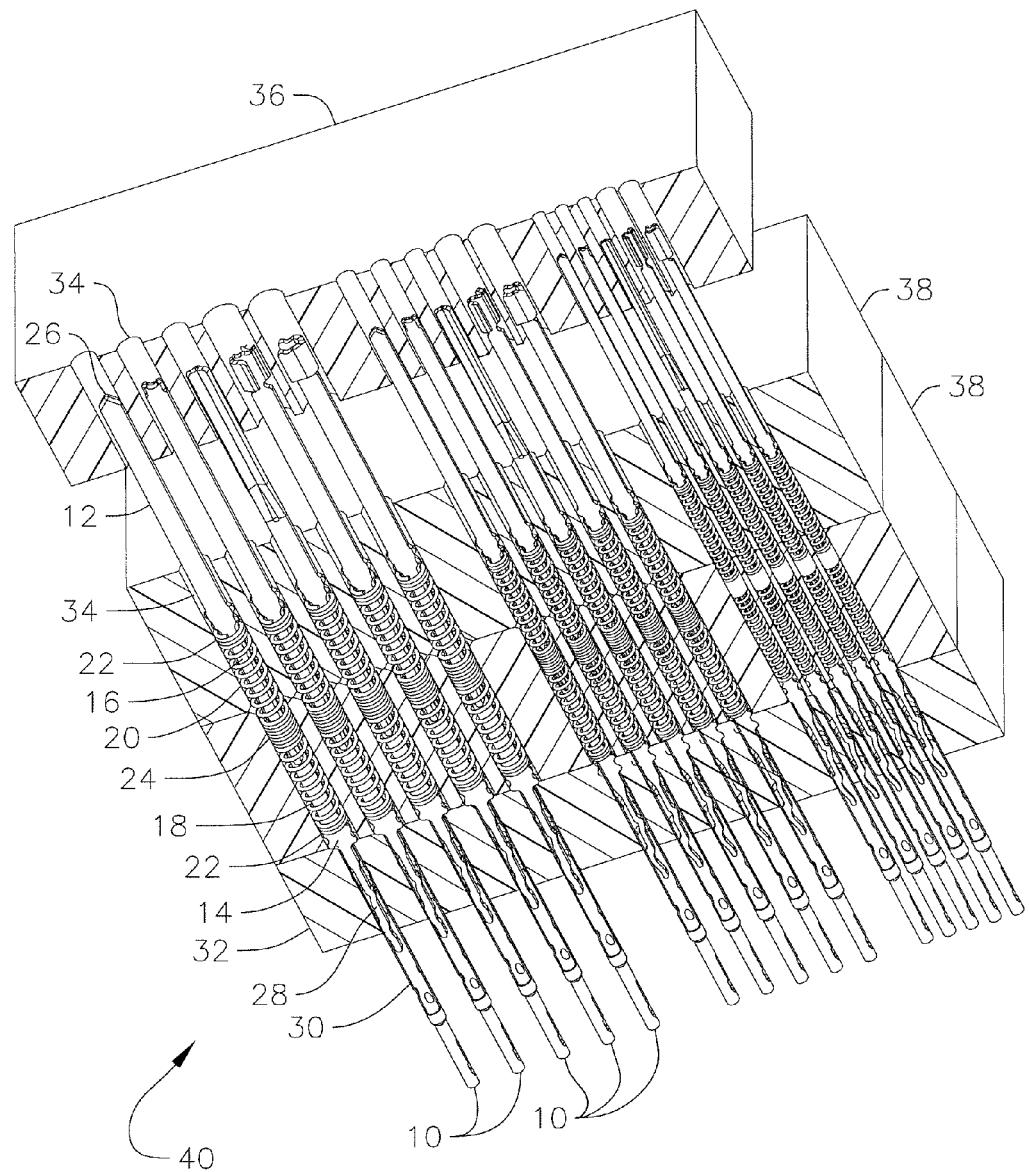
FIG. 1 is a cross-sectional view of a spring contact assembly of the present invention.

FIG. 1 illustrates a plurality of exemplary spring contact assemblies 10 of the present invention. Each spring contact assembly 10 includes a first contact member 12 and a second contact member 14. Contact members 12 and 14 have a flat configuration and partially overlap one another. The overlapping portions 16 and 18 respectively are positioned within a compression spring 20. In the embodiment shown in FIG. 1 compression spring 20 has reduced diameter end coils 22 and center coils 24. Contact member 12 has a contact tip 26 positioned at an end of the contact member opposite from overlapping portion 16. Contact member 14 has a terminal end 28 opposite from overlapping portion 18. Terminal end 28 is for retaining the spring contact assembly within receptacle 30.

There are a plurality of receptacles 30 positioned within a probe plate 32 and the spring contact assemblies 10 are positioned within holes 34 drilled through top plate 36 and a plurality of intermediate plates 38 positioned between top plate 36 and probe plate 32. It is to be understood that this is only exemplary of a configuration of a fixture 40 for use with the spring contact assemblies 10. Similarly, the fixture 40 could constitute a socket or housing for other test applications and have an array of receptacles for spring contact assemblies.

Figure 2:
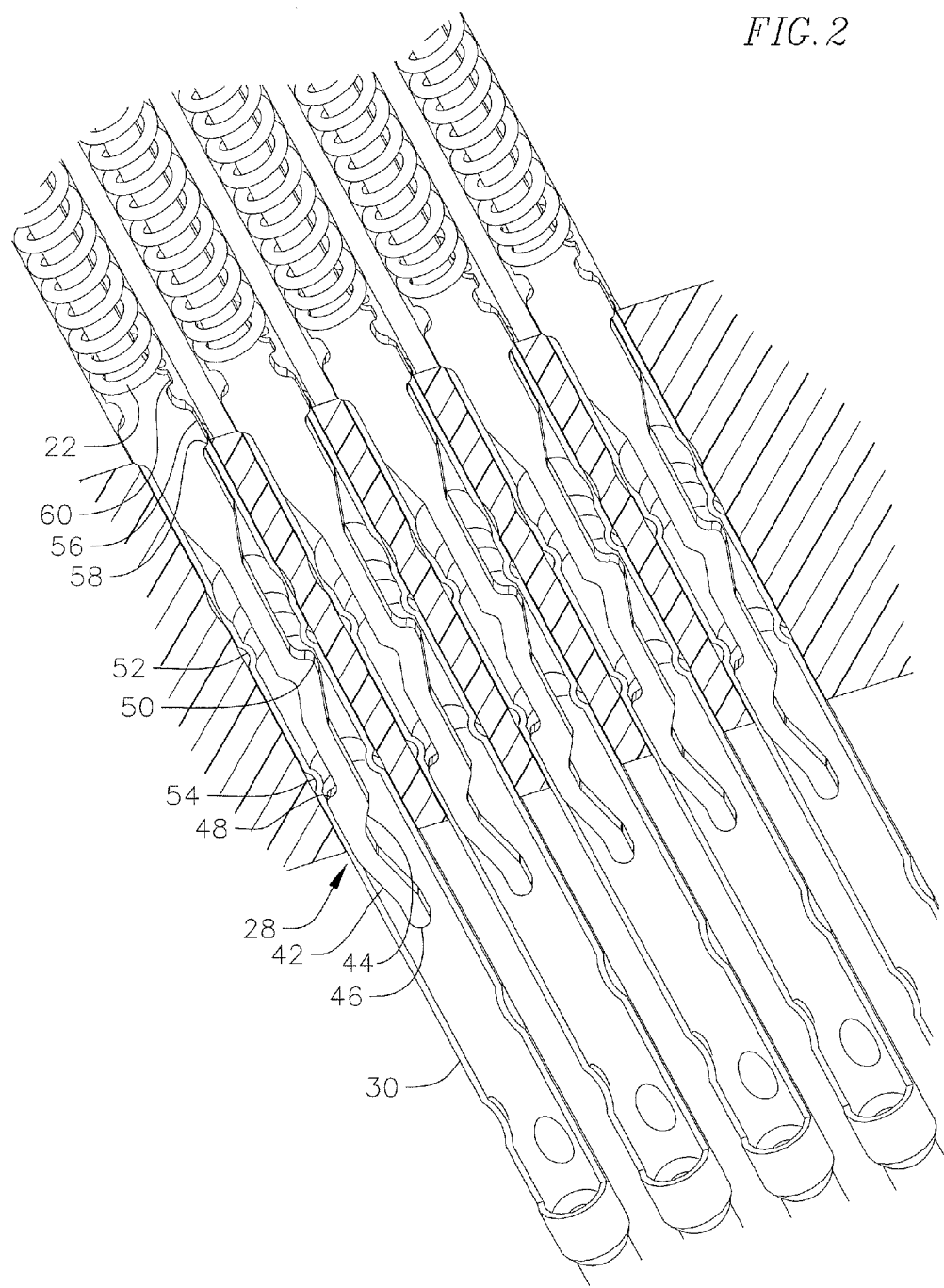
FIG. 2 is a cross-sectional detail view of the terminal design of the plunger of the spring contact assembly of FIG. 1.
Figure 3:
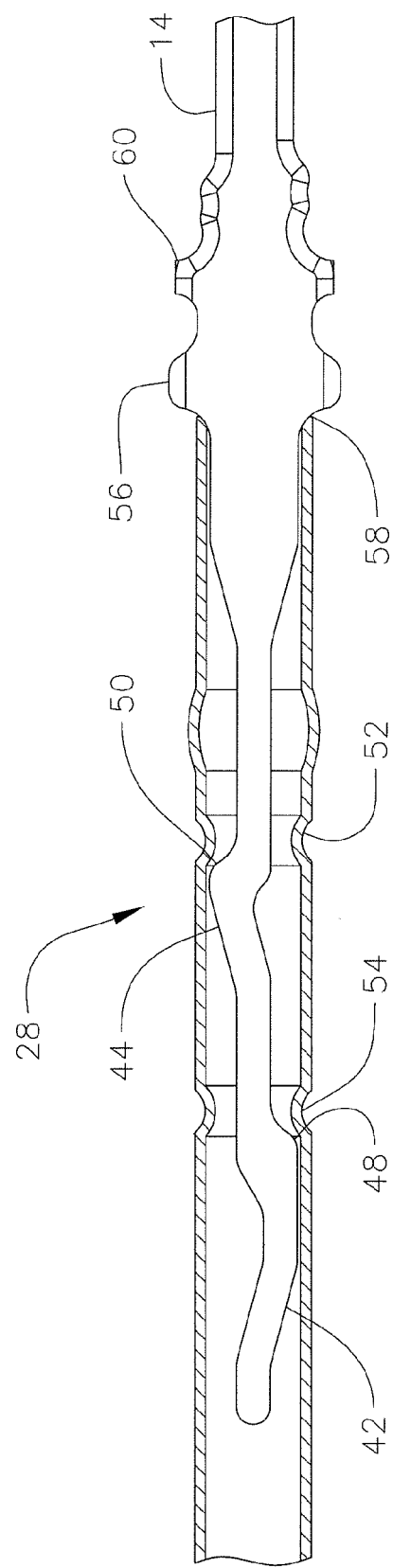
FIG. 3 is a cross-sectional view of the terminal of FIG. 2.

Contact members 12 and 14 have a flat configuration and are retained within the cylindrical receptacle 30 by terminal end 28. As shown best in FIGS. 2 and 3 terminal end 28 have a series of tapered cam surfaces 42 and 44 (two are shown) to facilitate retention of the spring contact assembly within the receptacle 30. Tapered cam surface 42 provides a lead-end angle on the tail 46 of terminal end 28 which extends to a sharp rear angle 48. Tapered cam surface 44 also extends to a sharp rear angle 50. As the terminal end is inserted into the receptacle 30 tapered cam surface 42 engages a first detent 52 allowing the terminal end 28 to flex inwardly as the angle cam surface rides over the first detent 52 and flex back outwardly as sharp rear angle 48 passes the first detent 52. Tapered cam angle 42 continues into a receptacle and similarly flexes and passes over a second detent 54. While tapered cam surface 42 passes over detent 54 tapered, cam surface 44 similarly passes over first detent 52 flexing the terminal end until sharp rear angle 50 passes over first detent 52. Once inserted within the receptacle, rear angles 48 and 50 are retained within the receptacle against first and second detents 52 and 54, respectively. Ideally, the spacing between first and second rear angles is similar to the spacing between first and second detents. The design of the terminal end is formed to allow the contact assembly to be inserted into the receptacle with minimal force but requires a much more significant force to remove the terminal from the receptacle. The cam surfaces engage one or more detents or other extensions or deformations in the receptacle that hold the flat contact member in place.

Contact member 14 includes a flange 56 which engages the end 58 of receptacle 30. Flange 56 prevents the contact member 14 from being further inserted into the receptacle. Contact member 14 further includes a wider spring flange 60 for receipt of end coils 22 of compression spring 20.

Figure 4:
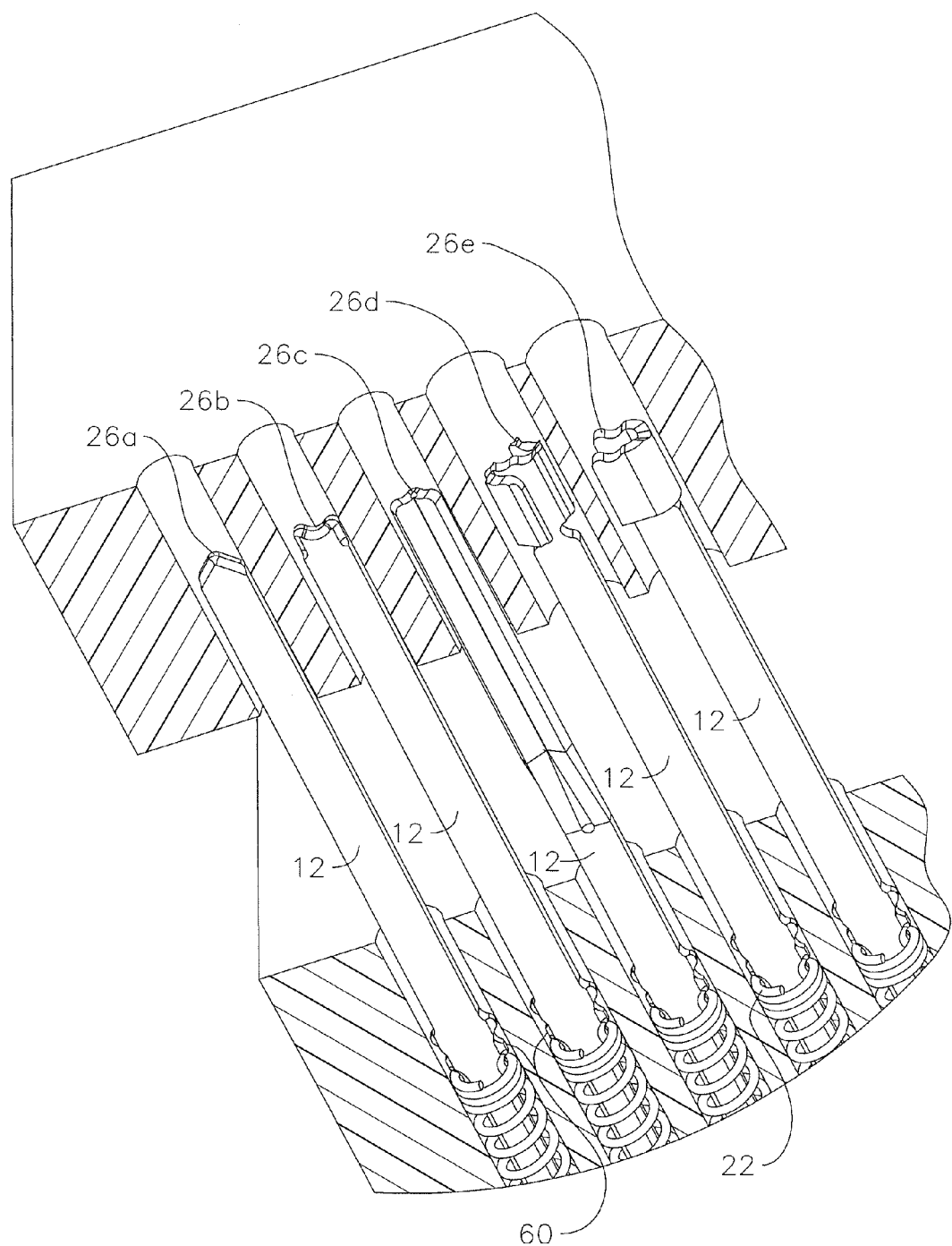
FIG. 4 is a detail view of various contact tip designs of the spring contact assembly of FIG. 1.

Referring to FIG. 4 contact member 12 also includes a spring flange 60 for retention of end coils 22 and can have a variety of different geometrical three dimensional shape contact tips 26. Tip 26a can be a baloney style tip which is a rounded tip from side-to-side and front to back. Tip 26b is "U" or forked shaped by removing portions of the tip on either side and the front and the back while forming a "U" or fork shaped upper surface. Tip 26c is "V" shaped and includes bending a "V" along the end length of the contact member. Tip 26d is "S" shaped which is formed by stamping a "T" shaped end and folding the ends into an "S" shape. Tip 26e is a "C" shape which is formed by stamping initially an "L" shape on the end and folding the end of the "L" over into the "U" shape. Although a number of three dimensional tip configurations are illustrated, it is to be understood that a number of geometrical configurations are contemplated herein.

Although the present invention has been described and illustrated with respect to several embodiments thereof, it is to be understood that the invention is not to be so limited that changes and modifications can be made herein which are within the full intended scope of the invention as hereinafter claimed. For example, spring contact assembly 10 is illustrated with respect to two contact members 12 and 14 wherein contact member 14 has a terminal end positioned within receptacle 30. A novel terminal design for a spring contact assembly can include a configuration where a flat plunger is retained within a cylindrical barrel having a spring positioned within the barrel. The barrel can be cylindrical or can be rectangular for receipt of a flat contact member which also can be referred to as a plunger.

What is claimed is:
1. A compliant contact assembly comprising:
a first flat contact member having a terminal end;
said terminal end having at least one tapered cam surface adjacent a rear angle;
a second contact member partially overlapping the first flat contact member;
a compression spring positioned around the overlapping portions of the first contact member and the second contact member; and
a receptacle having at least one detent, wherein the tapered cam surface engages the detent as the terminal end is inserted into the receptacle until the rear angle passes over the detent which retains the terminal end within the receptacle.

2. The contact assembly of claim 1 wherein the terminal end includes a second tapered cam surface spaced from the first tapered cam surface and a second rear angle adjacent the second tapered cam surface and the receptacle includes a second detent spaced from the first detent wherein the first and second tapered cam surfaces engages the first and second detents as the terminal end is inserted into the receptacle until the first and second rear angles pass over the first and second detents.

3. The contact assembly of claim 1 wherein the second contact member has a flat configuration and includes a contact tip.

4. The contact assembly claim 3 wherein the contact tip has a three dimensional contact surface.

5. The contact assembly of claim 4 wherein the contact surface is U-shaped.

6. The contact assembly of claim 4 wherein the contact surface is V-shaped.

7. The contact assembly of claim 4 wherein the contact surface is C-shaped.

8. The contact assembly of claim 4 wherein the contact surface is S-shaped.

9. A combination of a flat contact member and a receptacle wherein the flat contact member has a terminal end having at least one tapered cam surface adjacent a rear angle and the receptacle has at least one detent wherein the tapered cam surface engages the detent as the terminal end is inserted into the receptacle temporarily flexing the terminal end until the rear angle passes over the detent which retains the terminal end within the receptacle.

10. The combination of claim 9 wherein the terminal end includes a second tapered cam surface spaced from the first tapered cam surface and a second rear angle adjacent the second tapered cam surface and the receptacle includes a second detent spaced from the first detent wherein the first and second tapered cam surfaces engages the first and second detents as the terminal end is inserted into the receptacle temporarily flexing the terminal end until the first and second rear angles pass over the first and second detents.

11. The combination of claim 9 wherein the combination further includes a second contact member partially overlapping the flat contact member and a compression spring positioned around the overlapping portions of the flat contact member and the second contact member.

12. The combination of claim 11 wherein the second contact member includes a contact tip.

13. The combination of claim 12 wherein the contact tip has a three dimensional contact surface.

14. The combination of claim 13 wherein the contact surface is U-shaped.

15. The combination of claim 13 wherein the contact surface is V-shaped.

16. The combination of claim 13 wherein the contact surface is C-shaped.

17. The combination of claim 13 wherein the contact surface is S-shaped.

18. A flat test probe for insertion into a receptacle that has a protrusion, the flat test probe comprising a body portion and a tail portion, the tail portion having an angled guiding surface and a stop surface wherein the tail portion flexes when the angled guiding surface engages the protrusion and returns to a non-flexed position when the angled guiding surface has passed over the protrusion and the stop surface is adjacent the protrusion.

19. The flat test probe of claim 18 wherein the tail portion includes a second angled guiding surface and a second stop surface.

20. The flat test probe of claim 19 wherein the second angled guiding surface and the second stop surface are positioned on an opposite side of the tail portion from the angled guiding surface and the stop surface.

\* \* \* \* \*